(12) United States Patent
Lingunis et al.

(10) Patent No.: US 7,507,661 B2
(45) Date of Patent: Mar. 24, 2009

(54) METHOD OF FORMING NARROWLY SPACED FLASH MEMORY CONTACT OPENINGS AND LITHOGRAPHY MASKS

(75) Inventors: Emmanuil H. Lingunis, San Jose, CA (US); Ning Cheng, Cupertino, CA (US); Mark Ramsbey, Sunnyvale, CA (US); Kouros Ghandehari, Santa Clara, CA (US); Anna Minvielle, San Jose, CA (US); Hung-Eil Kim, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 591 days.

(21) Appl. No.: 10/916,167

(22) Filed: Aug. 11, 2004

(65) Prior Publication Data
US 2006/0035459 A1   Feb. 16, 2006

(51) Int. Cl.
*H01L 21/44* (2006.01)

(52) U.S. Cl. .................. 438/666; 438/668; 438/674; 438/675; 438/942; 438/947; 430/5

(58) Field of Classification Search ............... None
See application file for complete search history.

(56) References Cited

U.S. PATENT DOCUMENTS

| | | | |
|---|---|---|---|
| 5,723,233 A | 3/1998 | Garza et al. | |
| 5,740,068 A | 4/1998 | Liebmann et al. | |
| 5,821,014 A | 10/1998 | Chen et al. | |
| 5,858,591 A | 1/1999 | Lin et al. | |
| 5,991,006 A | 11/1999 | Tsudaka | |
| 6,044,007 A | 3/2000 | Capodieci | |
| 6,194,104 B1 | 2/2001 | Hsu | |
| 6,383,691 B1 * | 5/2002 | Seitz et al. | 430/5 |
| 6,492,066 B1 | 12/2002 | Capodieci et al. | |
| 6,574,784 B1 | 6/2003 | Lippincott et al. | |
| 6,660,436 B1 | 12/2003 | Chen et al. | |
| 6,664,010 B2 | 12/2003 | Ahrens et al. | |
| 2001/0002713 A1 | 6/2001 | Goda et al. | |
| 2003/0104290 A1 | 6/2003 | Iwasaki et al. | |

OTHER PUBLICATIONS

International Search Report, Int'l Application No. PCT/US2005/015132, Int'l Filing Date Apr. 29, 2005, 2 pgs.

* cited by examiner

*Primary Examiner*—Zandra Smith
*Assistant Examiner*—Khanh B Duong
(74) *Attorney, Agent, or Firm*—Eschweiler & Associates, LLC

(57) ABSTRACT

A method is provided for creating optical features on a lithography mask for use in patterning a series of openings of an etch mask on a semiconductor device wafer, comprising creating a series of optical features spaced on the lithography mask from one another along a first direction, where the individual optical features have first mask feature dimensions along the first direction that are smaller than a desired first dimension for the openings to be patterned in the etch mask.

8 Claims, 11 Drawing Sheets

METHOD OF FORMING NARROWLY SPACED FLASH MEMORY CONTACT OPENINGS AND LITHOGRAPHY MASKS

FIELD OF INVENTION

The invention is generally related to the field of semiconductor devices and more particularly to forming narrowly spaced flash memory array contact openings for bitline or wordline contacts in the manufacture of semiconductor devices.

BACKGROUND OF THE INVENTION

Flash memory is a non-volatile type of memory which can be rewritten and retain its data content without power. Flash and other types of electronic memory devices are constructed of memory cells that individually store and provide access to data. A typical memory cell stores a single binary piece of information referred to as a bit, which has one of two possible states. The cells are commonly organized into multiple cell units such as bytes having eight cells and words having sixteen or more such cells, usually configured in multiples of eight. Storage of data in such memory device architectures is performed by writing to a particular set of memory cells, sometimes referred to as programming the cells, where the data can then be retrieved in a read operation. In addition to programming and read operations, groups of cells in a memory device may be erased, wherein each cell in the group is set to a known state. In typical single-bit flash devices, each cell has one of two possible data states, either a programmed state or an erased state, where the data states correspond to the two possible binary states of the corresponding bit (e.g., programmed state represents binary "0" and erased state represents binary "1"). More recently, cells structures have been developed that are capable of storing two physically separated bits. Other multi-bit structures have been proposed, in which different multi-bit data combinations are represented as electrically distinguishable programming levels in a given cell.

Conventional flash memory cells include a metal oxide semiconductor (MOS) device with a gate structure in which data may be retained in the form of trapped electrical charge. The erase, program, and read operations are commonly performed by application of appropriate voltages to certain terminals of the cell MOS device. In a program or erase operation, the voltages are applied so as to cause a charge to be stored in the memory cell or removed from the cell, thereby changing or setting a threshold voltage of the cell. In a read operation, appropriate voltages are applied to cause a cell current to flow, wherein the amount of such current is related to the threshold voltage state of the cell and is thus indicative of the value of the data stored in the cell.

Conventional single-bit flash memory cells are often formed as a "stacked gate" or "SONOS" cell types. Stacked gate cells include a transistor structure having a source, a drain, and a channel in a substrate or p-well thereof, as well as a stacked gate structure overlying the channel that includes a gate dielectric layer (sometimes referred to as a tunnel oxide) formed on the surface of the P-well. The stacked gate also includes a polysilicon floating gate overlying the tunnel oxide and an interpoly dielectric layer overlying the floating gate. A doped polysilicon control gate overlies the interpoly dielectric layer to complete the stacked gate structure. The interpoly dielectric layer is often a multilayer insulator such as an oxide-nitride-oxide (ONO) layer having two oxide layers sandwiching a nitride layer. Conventional SONOS type cells (e.g., silicon-oxide-nitride-oxide-silicon) also include an ONO structure formed over the substrate channel, with a control gate formed over the ONO structure, but without a floating gate.

A continuing trend in flash and other types of memory device designs is the reduction of device dimensions and feature spacings, referred to as scaling. Other design goals include reducing power consumption and operating voltages in flash memories, as well as reducing the time required to perform read, program, and erase operations. Data in flash memory arrays is accessed along bitlines, typically formed as implanted lines that operate as the cell source/drains. Memory access speeds and device power consumption are adversely affected by high bitline contact resistance. The bitline contact resistance is in part affected by the electrical connection between the implanted source/drain regions of the substrate and overlying interconnection (e.g., metalization structures), usually consisting of a conductive contact formed through an intervening dielectric material. As flash memory devices are scaled, however, it becomes more difficult to maintain low bitline contact resistance, particularly where memory array bitlines become very thin and are spaced more closely (e.g., scaled bitline widths and bitline pitch). Accordingly, there remains a need for improved flash memory device fabrication techniques by which low bitline contact resistance can be facilitated in scaled flash memory devices.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later. The invention relates to semiconductor device manufacturing techniques that may be employed in fabricating flash memory devices, wherein optical features are provided on a lithography mask to be used in patterning a series of openings of an etch mask on a semiconductor device wafer, such as for creating bitline or wordline contact openings in a flash memory array. The invention may be employed to facilitate low bitline or wordline contact resistance in scaled flash memory arrays, and has particular utility in situations where a series of bitline or wordline contact openings are to be formed in close proximity along a first direction in a semiconductor device.

According to one aspect of the invention, a method is provided for forming contacts in a flash memory device. A lithography mask is provided, which comprises contact features along a row direction, where the contact features have contact row direction dimensions that are smaller than a desired contact row direction dimension. An etch mask is then patterned in the flash device using the lithography mask, and contact openings are etched in the device using the etch mask. Conductive material is then formed in the contact openings to create contacts in the device. The reduced feature dimensions in the row direction compensates for optical proximity effects in transferring the lithography mask pattern to the etch mask, particularly where the features are closely spaced along the row direction, by which the contacts and the openings therefor are created having row direction dimensions closer to the desired dimension than was possible using conventional techniques. The desired contact shapes and the lithography mask features can be of any shape, such as squares, rectangles, circles, ovals, oblong shapes, polygons, or others, for forming contact openings for bitline, wordlines, or other signal connections. In one possible implementation, the lithography mask is provided with generally rectangular contact features that have row direction dimensions about 30 percent smaller than the desired contact row direction dimension, wherein optical proximity effects and other optical pattern transfer effects may result in corner rounding and extension of the row direction dimensions as the pattern is transferred to the etch mask. In addition, the contact features of the lithography mask may have column direction dimensions substantially equal to or even greater than the desired contact row direction dimension, so as to facilitate low bitline or wordline contact resistance, even in scaled flash memory devices.

Another aspect of the invention provides a method for creating openings in a semiconductor device. The method comprises providing a lithography mask having optical features spaced from one another along a first direction, where the optical features have first mask feature dimensions along the first direction that are smaller than a desired first dimension for openings in the semiconductor device. The method further comprises patterning an etch mask in the semiconductor device using the lithography mask, and etching openings in the semiconductor device using the etch mask. In one example, the optical features of the lithography mask have first mask feature dimensions along the first direction that are about 30 percent smaller than the desired first dimension, as well as second mask feature dimensions along a second direction that are larger than the desired first dimension, where the first and second directions are substantially orthogonal.

Yet another aspect of the invention provides a method for creating optical features on a lithography mask for use in patterning a series of openings of an etch mask on a semiconductor device wafer. The method comprises determining a desired first dimension along a first direction for a series of substantially similar openings to be patterned in an etch mask, where the openings are to be spaced from one another along the first direction. The method further comprises creating a series of optical features spaced from one another along the first direction on a lithography mask, the individual optical features having first mask feature dimensions along the first direction that are smaller than the desired first dimension for the openings to be patterned in the etch mask, such as about 30 percent smaller in one possible implementation. The optical features of the lithography mask may be substantially rectangular, and may have second dimensions along a second substantially orthogonal direction, that are substantially equal to or larger than the desired first dimension.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIGS. 3-14 are partial side elevation views in section illustrating the exemplary flash memory device of FIGS. 1A-1E undergoing fabrication processing according to the invention;

DETAILED DESCRIPTION OF THE INVENTION

One or more implementations of the present invention will now be described with reference to the drawings, wherein like reference numerals are used to refer to like elements throughout. One or more aspects of the invention are hereinafter illustrated and described in the context of an exemplary flash memory device in which various techniques are employed in forming rows of bitline contacts in a virtual ground flash type array of multi-bit memory cells, wherein the structures illustrated herein are not necessarily drawn to scale. The invention may alternatively be employed in conjunction with other semiconductor devices, including memory devices having single-bit flash cells or various multi-bit flash cells. Moreover, the invention can be used in forming any type of contact openings, including but not limited to bitline contact openings and wordline contact openings. Furthermore, the various methods of the present invention may be employed in fabricating memory arrays of any architecture, including but not limited to NOR arrays, virtual ground arrays, NAND arrays, DINOR arrays, etc., wherein all such alternative implementations are contemplated as falling within the scope of the present invention and the appended claims.

The invention provides techniques for fabricating flash memory and other semiconductor devices and lithography masks therefor, in which optical features are created on a lithography mask for use in patterning a series of openings of an etch mask on a semiconductor device wafer, where the individual optical features have first mask feature dimensions along a first direction that are smaller than a desired first dimension for the openings to be patterned in the etch mask. The invention facilitates forming etch mask openings, and thus etched contact openings, of generally desired dimensions along a first direction in the presence of optical proximity distortion effects that may occur while patterning the etch mask.

In the case of bitline or wordline contact rows in a memory array, the inventors have appreciated that advanced scaling of flash memory array feature sizes and spacings may require bitline and/or wordline spacings and widths that approach the wavelength of light used to expose photoresist through a lithography mask in the creation of an etch mask for etching bitline contact openings, leading to optical proximity effects. In particular, the inventors have found that such optical proximity effects can lead to aberrations or distortions in feature dimensions (e.g., openings) in the patterned etch mask openings, where the patterned dimensions on the etch mask are longer than the corresponding dimensions of the lithography mask features along a first direction, where multiple, closely spaced, features are arranged in a row or column along the first direction. In the case of rows of scaled bitline contacts, the invention may be advantageously employed to ensure that the final bitline contacts are of suitable dimensions to ensure low bitline contact resistance, while minimizing the chance of bitline contacts shorting to the substrate between bitlines (e.g., and thereby causing lowered bitline-to-bitline breakdown voltages) or even contacting adjacent bitlines.

The invention is hereinafter illustrated and described in the context of an exemplary semiconductor device 100 having one or more memory arrays 54 comprised of dual-bit SONOS type flash memory cells 101 arranged in a virtual ground type array architecture. The device 100 is illustrated and described hereinafter with respect to FIGS. 1A-1E, where the device 100 can be a dedicated memory device or other type of semiconductor device (e.g., microprocessor, logic device, etc.) in which a flash memory array 54 is included. However, the various aspects of the invention may be employed in fabricating other semiconductor devices, wherein the invention is not limited to the illustrated examples.

Figure 1A:
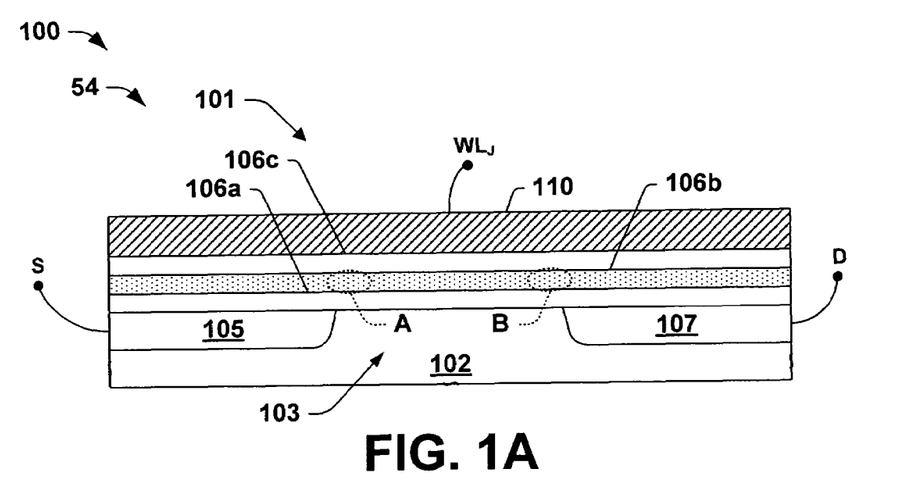
FIG. 1A is a partial side elevation view in section illustrating an exemplary flash memory cell.

Referring initially to FIG. 1A, an exemplary dual-bit flash memory cell 101 of the device 100 is illustrated, which is formed on/in a semiconductor body 102. The invention may be carried out in the fabrication of devices using any type of semiconductor body, including but not limited to the illustrated p-doped silicon substrate 102, SOI wafers, or other types of semiconductor bodies. The exemplary flash memory cell 101 of FIG. 1A comprises a gate structure that extends along a first (e.g., row) direction in the an array 54 along an array wordline $WL_J$, wherein the wordline $WL_J$ forms a shared control gate structure for cells along the same array row, with cells in neighboring rows (not shown) being situated along corresponding wordlines. The gate structure comprises a doped polysilicon control gate 110 and a charge trapping nitride material 106b located between the control gate 110 and a channel region 103 of the semiconductor body 102. The exemplary gate structure further comprises an upper oxide 106c located between the control gate 110 and the charge trapping material 106b, and a lower oxide 106a located between the charge trapping material 106b and the channel region 103.

The exemplary polysilicon control gate 110 is doped with one more n-type impurities (e.g., phosphorus, arsenic, antimony, etc.) thereby rendering the wordline/control gate 110 conductive. The control gate 110 may alternatively be fashioned from any suitable conductive material that allows a wordline voltage signal to establish electric fields within the channel region 103 for read operations, as well as to establish fields between the control gate 110 and the channel 103 or cell source/drains 105, 107 for programming and erase operations in the cell 101, including but not limited to doped polysilicon 110, metals, or other materials within the scope of the invention.

The charge trapping structure 106 of the exemplary cell 101 comprises three layers that form an ONO dielectric (oxide-nitride-oxide), although any suitable charge trapping structure may be provided between the control gate 110 and the cell channel 103. In the illustrated ONO structure 106, the charge trapping (e.g., trapping of electrons) is primarily in the nitride layer 106b. In general, the charge trapping structure 106 may be any dielectric layer or layers that are capable of, or which facilitate, trapping of electrons for setting or establishing a threshold voltage, and hence a data state, of the cell 101 within the scope of the invention. In the illustrated device 100, the oxide layers 106a and 106c are silicon dioxide (e.g., $SiO_2$ or other stoichiometric variants thereof), and the charge trapping material 106b is silicon nitride (e.g., $Si_3N_4$ or variants thereof), although any suitable charge trapping material or materials may be employed, including single or multi-layer structures, situated between the control gate 110 and the channel region 103.

The cell 101 further comprises first and second source/drains 105 and 107, respectively, located on lateral sides of the channel region 103 that form bitlines along a second (e.g., column) direction in the array 54, where the row and column directions are substantially orthogonal to one another. The first source/drain 105 (indicated as a source in FIG. 1A for purposes of illustration) comprises a first doped portion of the substrate 102, and the second source/drain 107 (indicated as a drain in FIG. 1A) comprises a second doped portion of the substrate 102, where the source 105 and drain 107 extend on laterally opposite sides of the channel 103. The various aspects of the invention may be used in forming bitline contacts to provide electrical coupling with the illustrated bitlines 105, 107, or other bitline structures (not shown).

As illustrated in FIG. 1A, the exemplary memory cell 101 is capable of storing two spatially separated binary data bits, including a left bit represented by the dashed circle A and a right bit represented by the dashed circle B. The dual-bit memory cell 101 is generally symmetrical, wherein the drain 107 and the source 105 are interchangeable, although asymmetric implementations are possible within the scope of the invention. In the exemplary cell 101, the left bitline 105 may serve as the source terminal and the right bitline 107 as the drain terminal with respect to the right bit B. Likewise, the right bitline 107 may serve as the source terminal and the left bitline 105 as the drain terminal for the left bit A. The present invention may be implemented in association with various single or multi-bit memory cell types, including the SONOS cell 101 of FIG. 1A as well as others not illustrated. In addition, the invention is applicable to such dual-bit memory devices wherein both bits (e.g., bits A and B of cell 101) are used for data or information storage, as well as those in which only one bit (e.g., bit A of cell 101) of the dual-bit cell is so used.

Figure 1B:
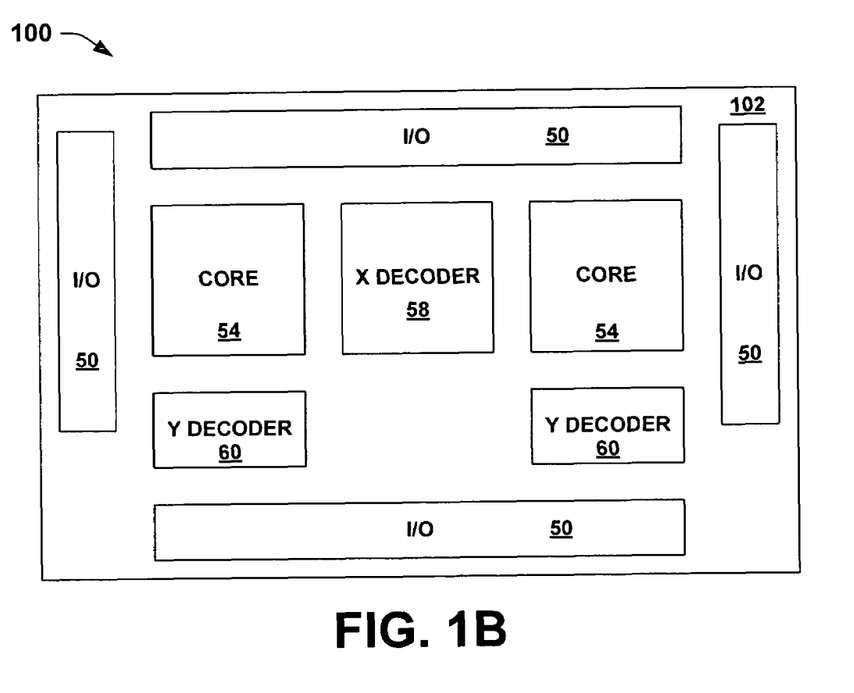
FIG. 1B is a simplified top plan view of a flash memory device in which one or more aspects of the invention may be carried out.
Figure 1C:
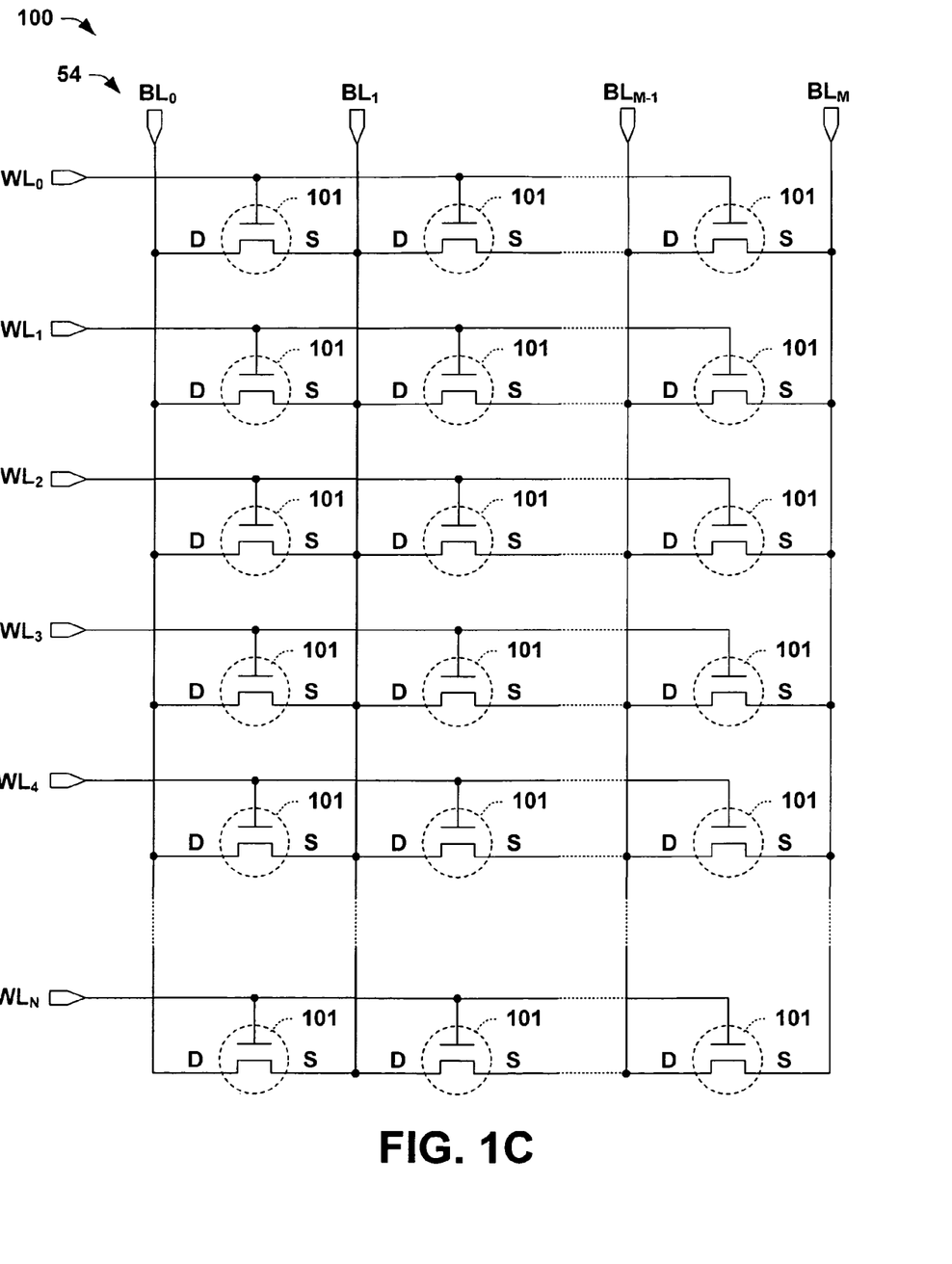
FIG. 1C is a schematic diagram illustrating a portion of a flash memory array in the device of FIG. 1B, organized in a virtual ground configuration.
Figure 1D:
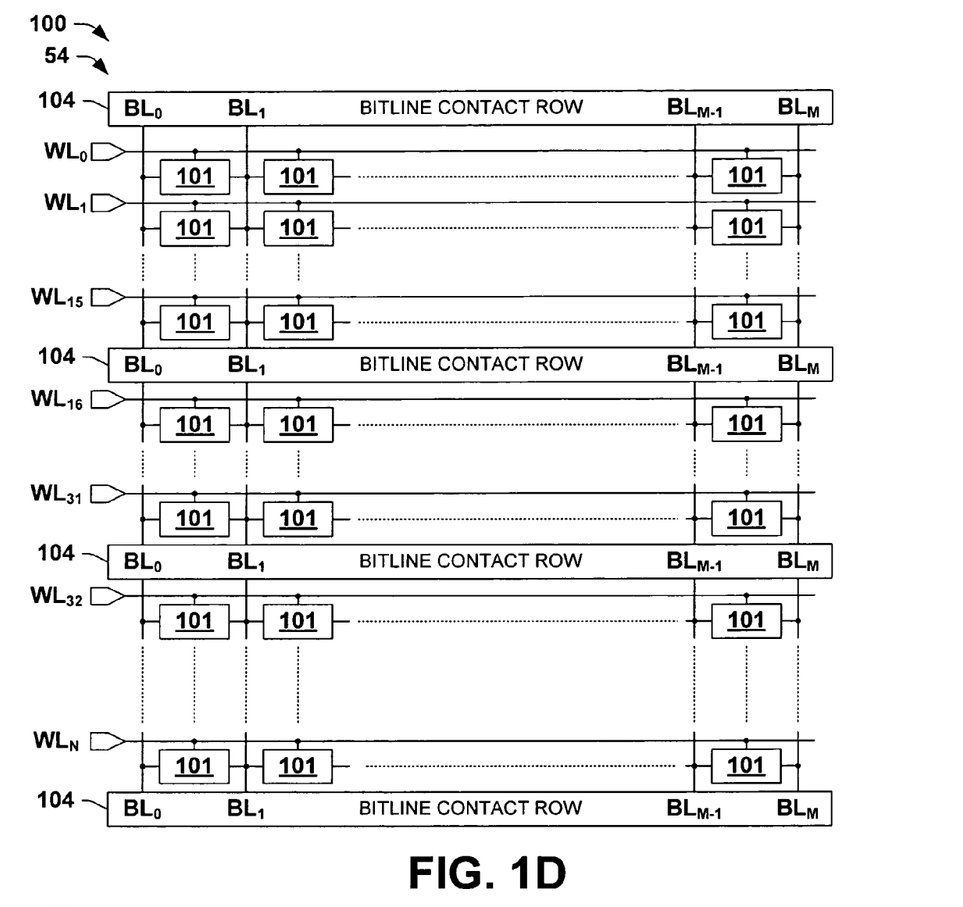
FIGS. 1D and 1E are schematic diagrams illustrating bitline contact rows in the array of FIGS. 1B and 1C.
Figure 1E:
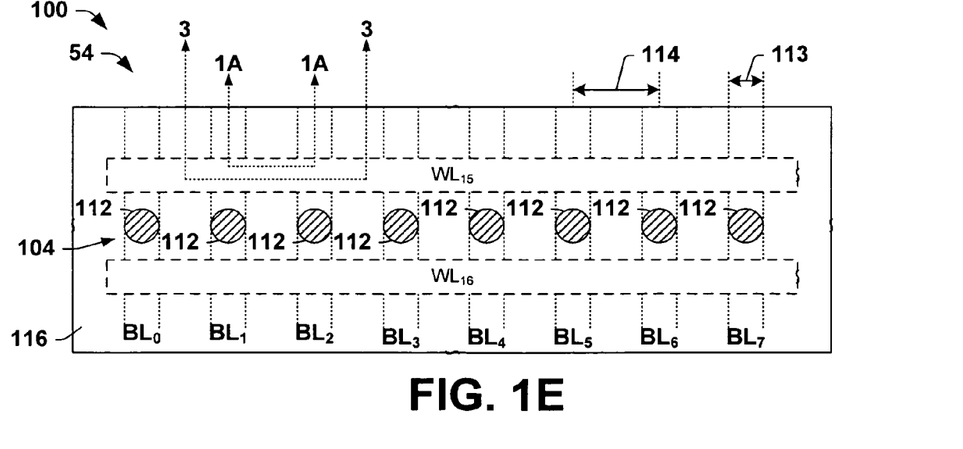

Referring also to FIGS. 1B-1E, FIG. 1B provides a simplified illustration of certain major components of the exemplary semiconductor device 100, and FIG. 1C schematically depicts a portion of an exemplary virtual ground flash memory cell array 54 in the device 100. FIGS. 1D and 1E are schematic diagrams illustrating exemplary bitline contact rows 104 located in the array 54 between groups of cell rows in the device 100 of FIGS. 1B and 1C. As shown in FIG. 1B, the exemplary dedicated memory device 100 comprises a semiconductor substrate 102 in which one or more high-density core regions and one or more low-density peripheral portions are formed. The core regions comprise one or more M×N array cores 54 of individually addressable, substantially identical flash memory cells 101, such as the cell 101 of FIG. 1A. The peripheral portions comprise I/O circuitry 50 and programming or decoder circuitry 58 and 60 for selectively addressing the individual memory cells 101 or groups (e.g., words) thereof. The programming circuitry comprises one or more x-direction (e.g., column) decoders 58 and y-direction (e.g., row) decoders 60, which, together with the I/O circuitry 50, operate to couple the body (e.g., substrate), gate, and/or source/drains (e.g., wordlines and bitlines) of selected addressed memory cells 101 with predetermined voltages or impedances during program, erase, and read operations. In this regard, the decoder and I/O circuitry provide the necessary wordline and bitline control signals during memory access operations, and buffer the incoming and outgoing data associated therewith, wherein the circuits 50, 58, and 60 may be fashioned from any suitable analog and/or logic circuits and devices.

FIG. 1C illustrates a portion of one of the core arrays 54 of the device 100, wherein portions of several rows and columns of flash cells 101 are illustrated along wordlines $WL_0$ through $WL_N$ and bitlines $BL_0$ through $BL_M$, respectively, where the array 54 is illustrated in a virtual ground configuration in this example. Alternatively, the invention may be employed in association with devices having other array architectures, including but not limited to NOR, NAND, DINOR, or others. As shown in FIG. 1C, the exemplary virtual ground array 54 comprises rows of flash cells 101 with control gate terminals (e.g., control gate 110 in FIG. 1A) coupled to a corresponding wordline WL along a first direction, as well as columns of cells 101 along a second orthogonal direction, having a drain of one cell 101 (e.g., drain 107) coupled to a corresponding bitline BL and the source (e.g., source 105) of an adjacent cell 101. In this configuration, the drain terminals 107 of the cells 101 within a given column are coupled to the same bitline BL.

Individual flash cells 101 may be selected via a corresponding wordline WL and a pair of bitlines BL bounding the target cell 101, wherein the bitline and wordline signals are generated by the decoder circuitry 58, 60 (FIG. 1B). Thus, for example, when a positive voltage is applied to the bitline BL coupled to the drain 107 of a selected cell 101, a conductive path is established between the drain 107 and the source 105 thereof, which is coupled to ground by provision of the appropriate bitline signals from the decoders 58, 60. In this manner, a virtual ground is formed by selectively connecting a ground to the bit line associated with the source terminal of only those flash cells 101 selected to be accessed. In the array 54, conductive n-doped polysilicon wordlines (e.g., control gates 110) are formed over the charge trapping materials 106b to create flash memory cells 101 in combination with n-doped bitline portions (e.g., sources 105 and drains 107) in the substrate 102, with the cells 101 organized along rows (e.g., wordlines) and columns (e.g., bitlines) in the virtual ground array 54.

As illustrated in FIGS. 1D and 1E, electrical contact is made to the array bitlines 105, 107 by means of rows 104 of conductive bitline contact structures 112, where the bitline contact rows 104 are situated at the upper and lower ends of the array 54 (e.g., above the first row and below the last row), as well as between groups of 16 array rows. As illustrated and described in greater detail below with respect to FIGS. 8-14, the contacts 112 extend through an inter-level or inter-layer dielectric (ILD) material 116 formed between the doped semiconductor source/drains (e.g., bitlines) 105, 107 and conductive interconnection routing structures in an overlying metalization level or metalization layer (not shown). The contacts 112 are formed by etching contact openings 118 in the ILD material 116 using an etch mask 117 with patterned openings 117a, as shown below in FIGS. 10 through 14.

As illustrated in FIG. 1E, the bitlines have a lateral width dimension 113 and a pitch (e.g., center-to-center spacing) dimension 114 along the row direction of the array 54. As semiconductor devices are scaled to ever shrinking sizes, the bitline width and pitch dimensions 113 and 114, respectively, are reduced. At the same time, however, it is desirable to maintain low bitline contact resistance to allow high-speed access to the memory cells 101 in the array 54 with minimal power consumption. The inventors have appreciated that optical proximity effects may cause distortion of patterned feature dimensions, such as corner rounding, wherein rectangular optical features on a lithography mask (e.g., reticle) may be patterned or transferred as more circular (e.g., corner-rounded) features on an etch mask 117 and on a wafer during semiconductor device fabrication. Moreover, the inventors have appreciated that as device dimensions (e.g., the bitline widths 113 and bitline pitch 114) are scaled ever smaller, optical proximity effects may cause unwanted lengthening of patterned features where a plurality of such features are closely spaced together, in the direction along a row of such features. For example, close spacing of the bitline contacts 112 along the row direction of the array 54 may lead to undesired lengthening of the contact openings during patterning of an etch mask, which in turn, worsens process alignment margins for forming the contacts 112 and may cause bitline shorting or other adverse effects. Although the bitline contacts 112 are illustrated in FIG. 1E has having diameter dimensions generally corresponding to the bitline widths 113, the contacts 112 may be made smaller or larger than the bitline widths 113, wherein the dimensions of the contacts 112 need not be related to the bitline widths 113.

Accordingly, the present invention provides techniques for forming bitline contacts and etch mask openings therefor, as well as methods for creating optical features on a lithography mask, that may be used to combat such adverse optical proximity effects in the manufacture of flash memories and other semiconductor devices. In this regard, although illustrated in the context of flash memory bitline contact rows 104, the various aspects of the invention may be employed in lithography operations for forming any type of openings using optical patterning, such as wordline contact openings or other openings in a semiconductor device, wherein the present invention and the appended claims are not limited to the illustrative examples herein.

Figure 2:
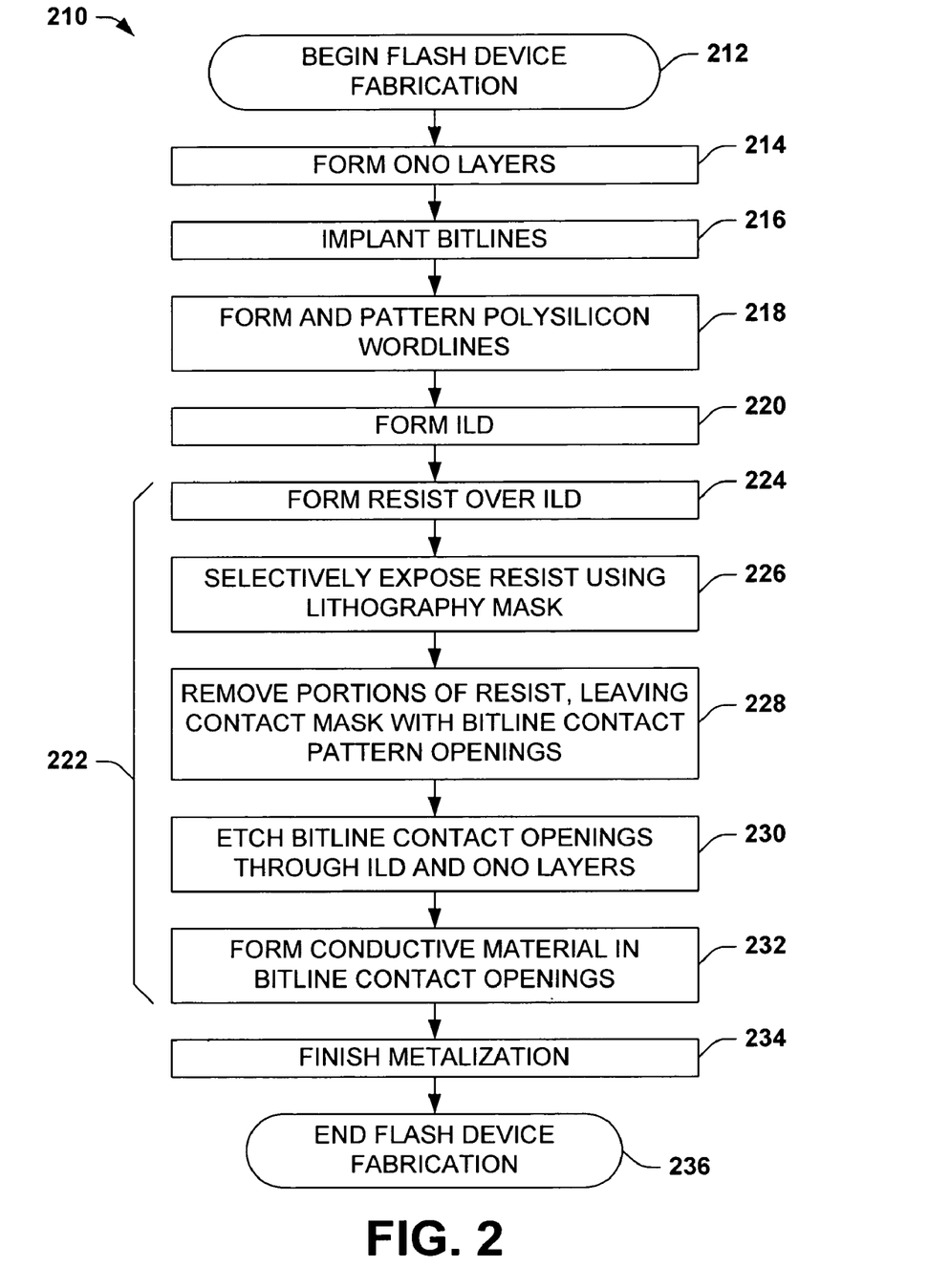
FIG. 2 is a flow diagram illustrating an exemplary method of fabricating flash memory devices and bitline contacts therefor in accordance with one or more aspects of the present invention.

To illustrate one particular application of the invention to the creation of the bitline contact rows 104 and the contacts 112 thereof, FIG. 2 depicts a simplified flow diagram showing an exemplary method 210 for fabricating a flash memory device (e.g., the exemplary device 100 or others), and FIGS.

3-14 illustrate the exemplary flash memory device 100 of FIGS. 1A-1E undergoing fabrication processing according to the invention. While the exemplary method 210 and other methods of the invention may be illustrated and described below as a series of acts or events, the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Further, the methods according to the present invention may be implemented in association with the fabrication and/or processing of flash memory devices illustrated and described herein as well as in association with other structures and devices not illustrated.

Figure 3:
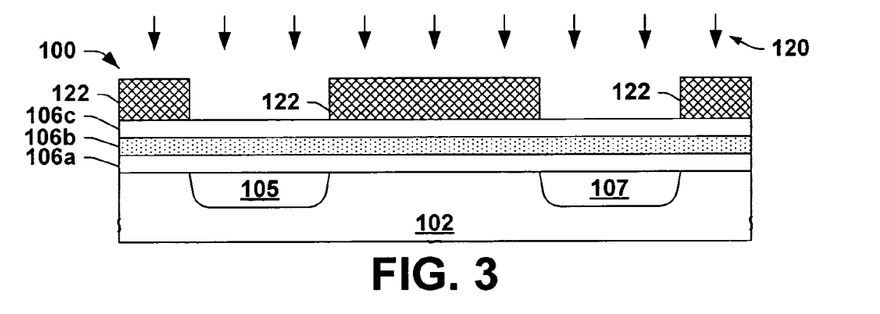

Beginning at 212, a tri-layer charge trapping (e.g., ONO) structure 106 is formed at 214 over a silicon substrate or other semiconductor body, for example, including a lower dielectric (e.g., silicon dioxide) material layer 106a, a charge trapping material layer 106b (e.g., silicon nitride $Si_3N_4$, etc.), and an upper dielectric (e.g., silicon dioxide, etc.) material layer 106c, as shown in FIG. 3. At 216, bitlines 105, 107 are selectively implanted along columns of the prospective memory array 54. As illustrated in FIG. 3, a mask 122 is formed over the ONO layers 106 using suitable photolithographic techniques, where the mask 122 exposes portions of the ONO layers 106 under which the bitlines (e.g., prospective source and drain regions 105 and 107) are to be formed. An implantation process 120 is then performed to implant suitable dopants (e.g., phosphorus, arsenic, antimony, etc.) through the exposed portions of the layers 106 and into the underlying substrate 102 to form the source 105 and the drain 107, leaving a channel region of the p-type substrate 102 therebetween. Other dopant types (e.g., n or p-type), compositions, and/or concentrations can alternatively be used to form the source 105 and the drain 107 (e.g., the bitlines of the exemplary virtual ground array 54) at 216, after which the mask 122 is removed. In one possible alternative, the bitline implantation at 216 can be performed prior to formation of some or all of the material layers 106, for example, prior to deposition of the upper dielectric 106c.

Figure 4:
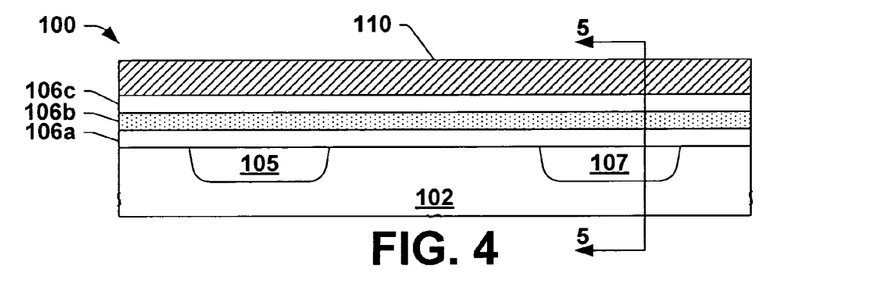
Figure 5:
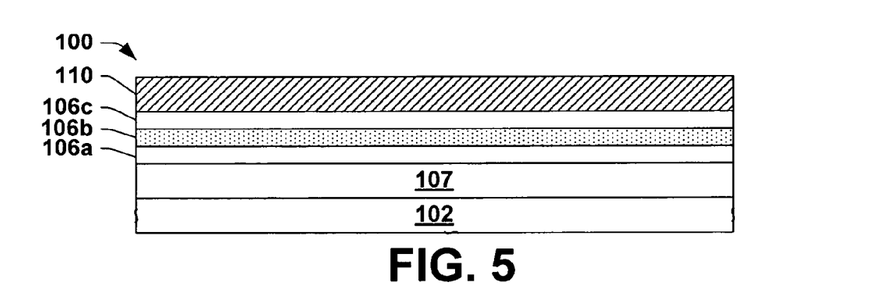
Figure 6:
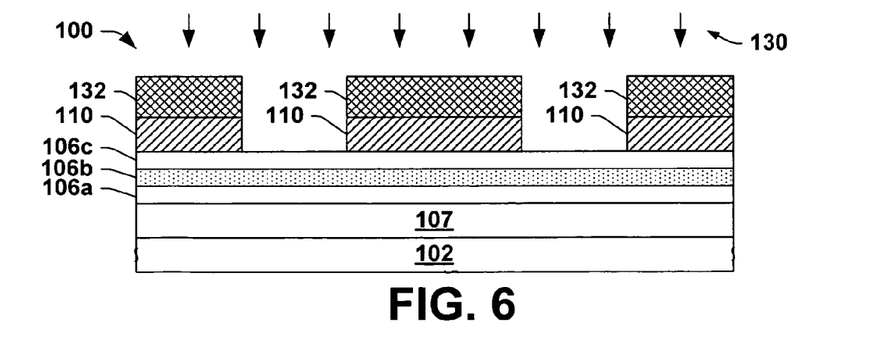
Figure 7:
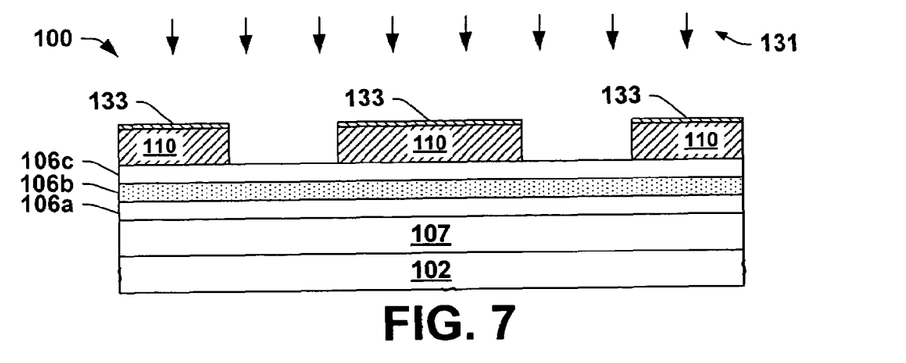
Figure 8:
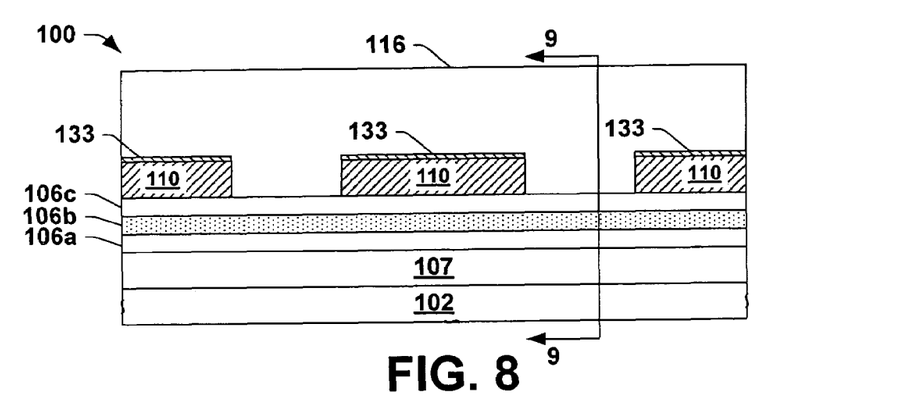
Figure 9:
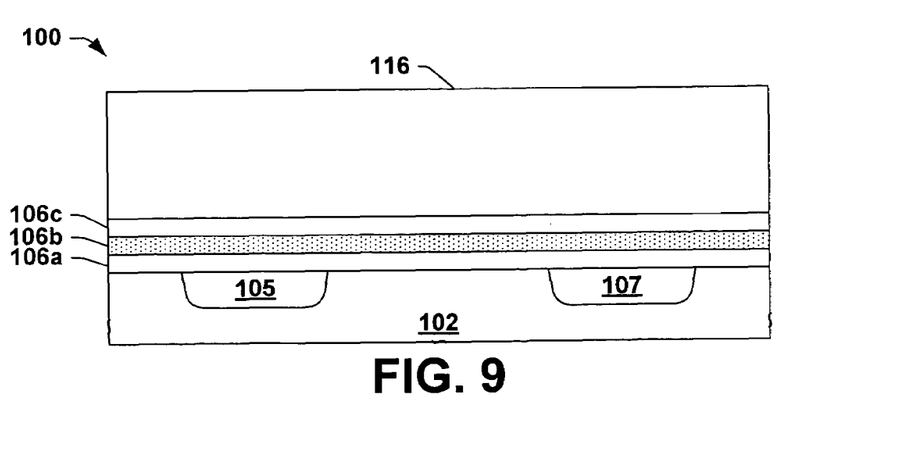

At 218, a polysilicon wordline or control gate structure 110 is formed and selectively implanted to provide conductive wordlines 110 along a first or row direction in the array 54. In FIGS. 4 and 5, a layer of polysilicon material 110 is deposited or otherwise formed at 218 over the ONO layers (e.g., polysilicon layer 110 is formed over the upper dielectric material 106c). FIGS. 5-8 illustrate sectional side elevation views taken along section line 5-5 in FIG. 4 through the exemplary bitline 107 to better illustrate the patterning of the polysilicon 110 in forming the array wordline structures. As illustrated in FIG. 6, the polysilicon 110 is selectively patterned to define polysilicon wordlines that operate as control gates for the cells 101. In the illustrated example, a wordline etch mask 132 is formed over the polysilicon 110, covering the prospective wordline structures and exposing the remainder of the device 100, and an etch process 130 is performed (e.g., reactive ion etching (RIE) or other suitable processes 130) to remove select portions of the polysilicon 110. The etch process 130 may, but need not, remove some or all of the ONO material layers 106 between adjacent patterned wordline/control gate structures 110. A silicidation 131 may then be performed in FIG. 7 to create cobalt or other metal silicide 133 above the patterned wordline structures.

In the exemplary device 100, the patterned polysilicon wordline/control gate structures 110 extend along the row direction generally perpendicular to the bitline (e.g., column) direction of the prospective flash memory array 54. However, other relative orientations are possible and are contemplated as falling within the scope of the invention. It is noted in this regard, that the bitline contacts 112 in the contact rows 104 (FIGS. 1D and 1E) are arranged in rows extending along the row direction, wherein the individual bitline contacts 112 are spaced from one another along the row direction.

At 220, a dielectric (ILD) material 116 is formed over the device 100 (FIGS. 8 and 9), such as an oxide or other low-k dielectric material. At 222, conductive bitline contacts 112 are formed through the ILD material 116 to provide electrical connection between the bitlines 105, 107 and conductive interconnection routing structures in a subsequently formed metalization layer (not shown). FIGS. 9, 10, and 12-14 illustrate sectional side elevation views taken along section line 9-9 in FIG. 8 through a space between successive wordlines 110 where prospective bitline contacts 112 are to be formed to better illustrate the patterning of the ILD and ONO materials 116 and 106, respectively, in forming bitline openings 118 in the device 100.

Figure 10:
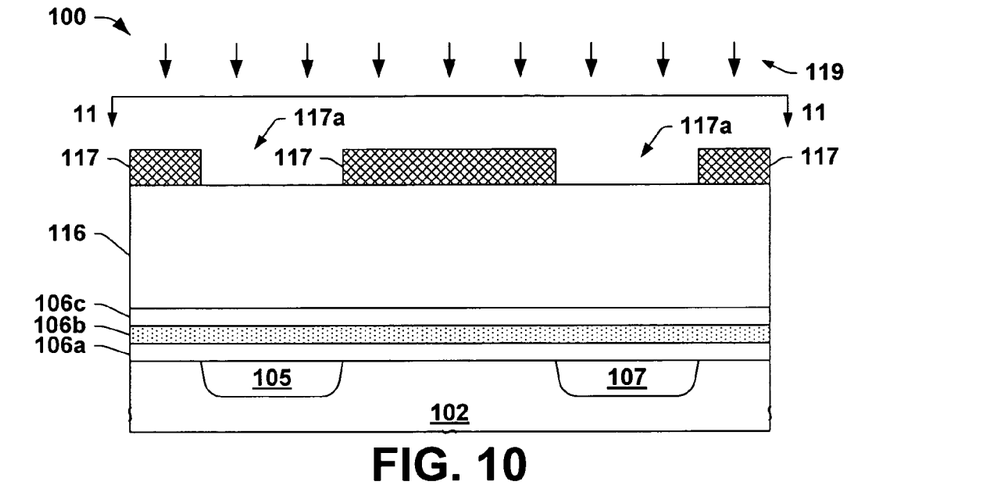

As illustrated in FIG. 10, a resist material 117 is formed at 224 over the ILD 116. A lithography process 119 is then performed at 226 and 228 to form openings through the resist 117 to expose portions of the ILD material 116 in locations where the prospective bitline contacts 112 are to be formed. At 226, the resist material 117 is selectively exposed to light or other radiation through a lithography mask, as illustrated and described in greater detail below with respect to FIGS. 11A, 11B, and 15A-18, and either the exposed or the unexposed portions of the resist 117 are removed at 228 (e.g., depending on whether positive or negative resist material 117 is used and whether the lithography mask is a positive or negative image), leaving a contact etch mask 117 with bitline contact pattern openings 117a therein.

Figure 11A:
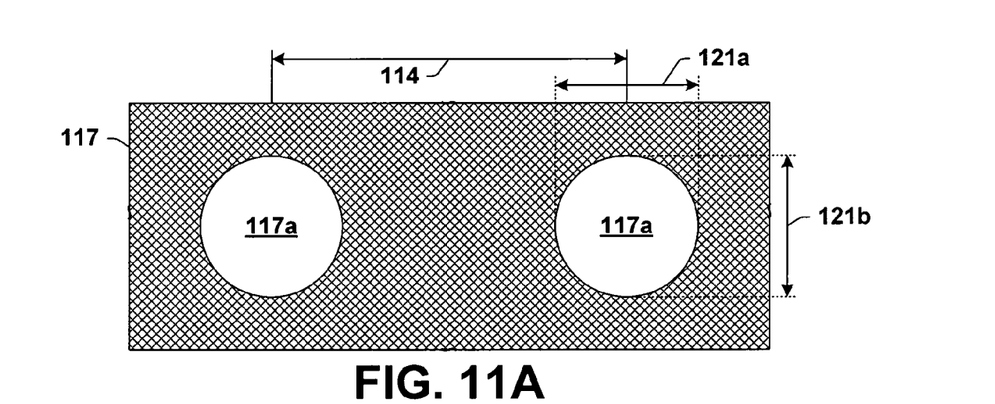
Figure 11B:
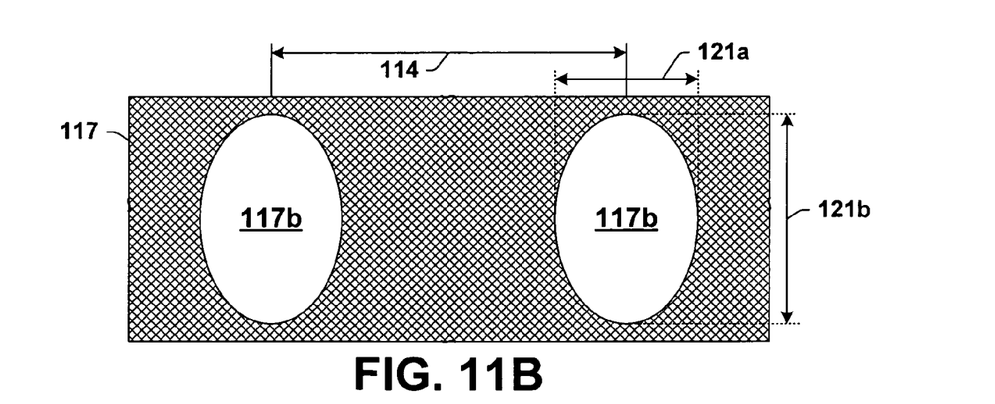

FIGS. 11A and 11B illustrate partial top plan views of two examples of the patterned etch mask 117 taken along line 11-11 of FIG. 10. In the example of FIG. 11A, the etch mask openings 117a are generally circular, with substantially equal dimensions 121a and 121b in the row and column directions, respectively. In the example of FIG. 11B, elongated or oblong contact etch mask openings 117b are formed, wherein the column direction dimension 121b is larger than the row direction dimension 121a. Referring also to FIG. 1E, the ideal row direction dimension 121a is equal to or less than the width dimension 113 of the bitlines 105, 107, which in combination with perfect row direction alignment of the openings 117a or 117b with the underlying bitlines 105, 107 will tend to minimize the bitline contact resistance in the device 100 for a given column direction dimension 121b. It is also noted with respect to FIG. 11B, that elongation of the etch mask openings in the column direction (e.g., within limitations imposed by the proximity of the wordlines 110 bounding the contacts 112, as in FIG. 1E), may also serve to reduce bitline contact resistance in the array 54. In this regard, the wordline structures 110 bounding the bitline contact rows (FIG. 1D) will in general be spaced beyond the normal array wordline pitch spacing, to allow for placement of the bitline contact rows 104, and to allow for such column direction elongation of the bitline contacts 112 and the corresponding elongation of the bitline contact etch mask openings 117b.

Figure 12:
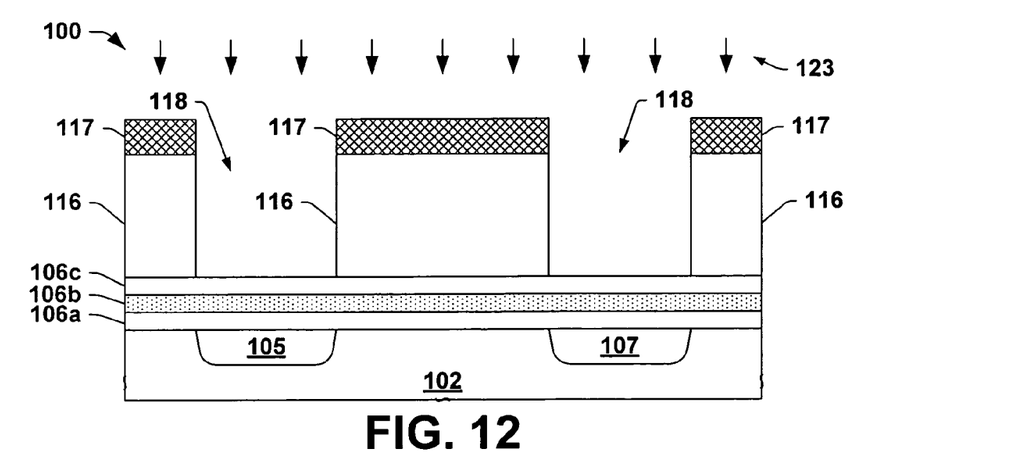
Figure 13:
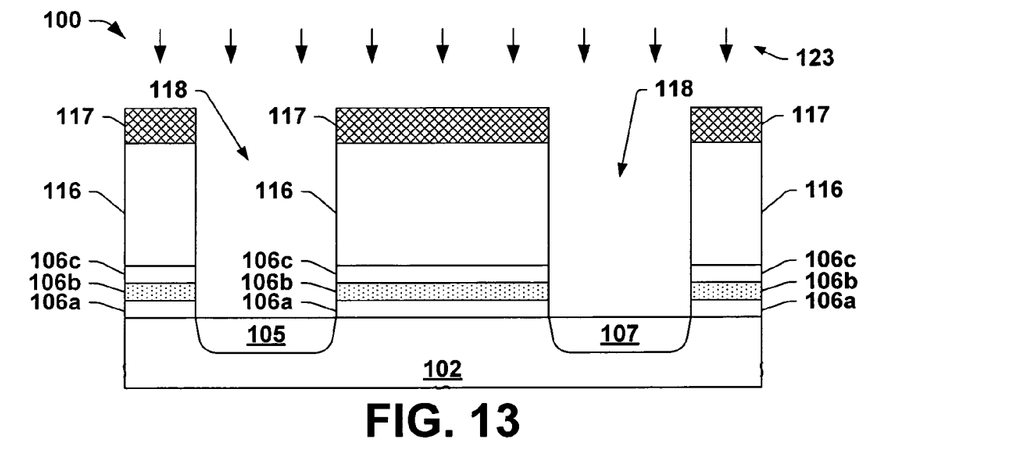
Figure 14:
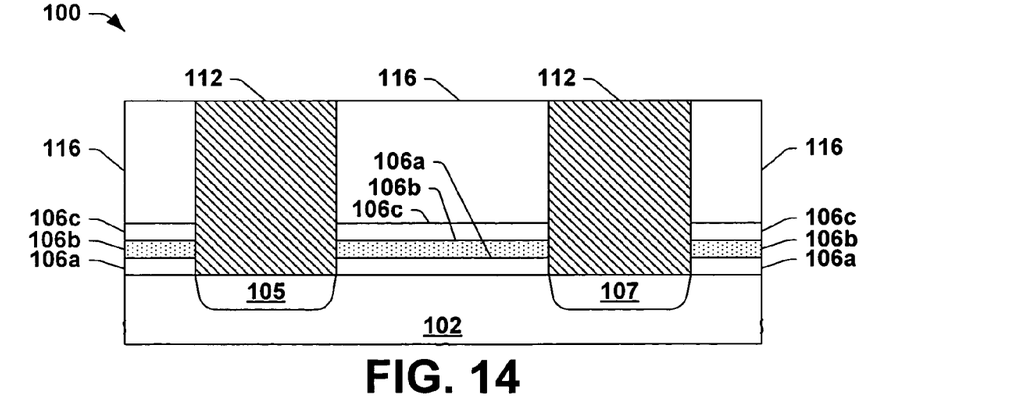

Referring now to FIGS. 2, 12, and 13, the method 210 continues at 230, where an ILD etch process 123 is performed with the etch mask 117 in place, to remove exposed portions of the ILD material 116 (FIG. 12) and the ONO layers 106 (FIG. 13) to create bitline contact openings 118. At 232, conductive material 112, such as tungsten, titanium, etc., is formed in the bitline contact openings 118, to form the contacts 112 as shown in FIG. 14. The formation of the conductive material 112 at 234 may include, for example, deposition of material 112 over the device 100, thermal annealing (e.g., RTA, etc.) to form silicide over the source/drains 105, 107 in the openings 118, and subsequent planarization processing (e.g., chemical mechanical polishing (CMP)) to provide a planar upper device surface with electrically separated bitline contacts 112 as in FIG. 14 and FIG. 1E above.

Referring now to FIGS. 15A-18, the invention may be employed to facilitate control over the lateral row direction and column direction dimensions of the contact etch mask openings 117a, 117b, by which control of the lateral dimensions of the bitline contacts 112 is provided. Control of the contact dimensions, in turn, facilitates control over the bitline contact resistance in the device 100. In addition, the invention allows correction or compensation for optical proximity and other patterning effects that have previously hampered pattern transfer in creating etch masks for forming closely spaced openings in the fabrication of semiconductor devices. The invention provides methods for forming bitline contacts and contact openings therefor in a flash memory device, in which a lithography mask is provided, having bitline contact features along a row direction, where the bitline contact features have bitline contact row direction dimensions smaller than a desired bitline contact row direction dimension. Thereafter, an etch mask in the device (e.g., mask 117 above) is patterned using the lithography mask, and the bitline contact openings are etched in the device using the patterned etch mask.

Figure 15A:
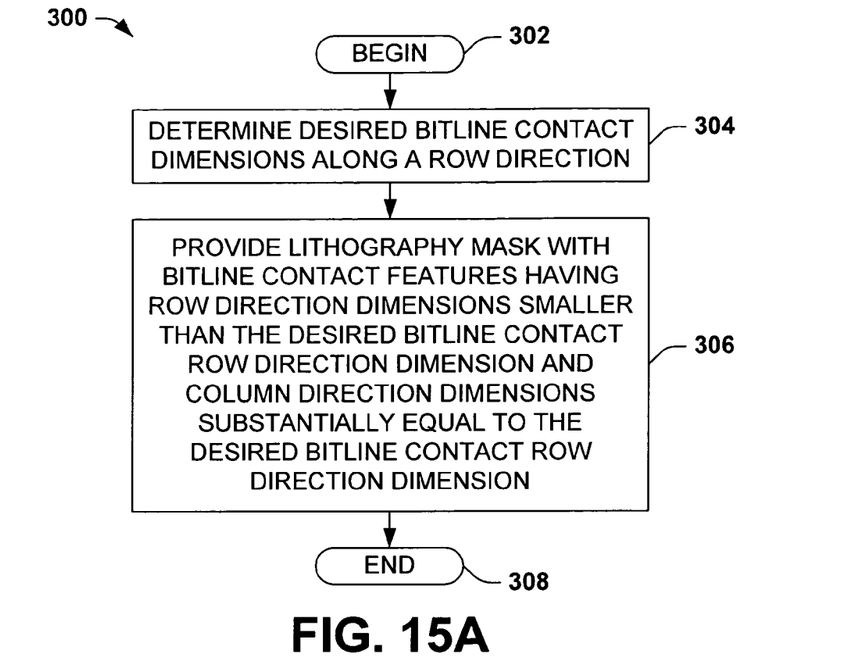
FIGS. 15A and 15B are flow diagrams illustrating methods of creating optical features on a lithography mask to be used for patterning a series of openings in an etch mask on a semiconductor device wafer in accordance with the invention.

FIG. 15A illustrates application of these principles of the invention in an exemplary method 300 for creating optical features on a lithography mask or reticle for subsequent use in patterning a series of openings in an etch mask (e.g., contact opening etch mask 117 above) on a semiconductor device 100. Beginning at 302, desired bitline contact dimensions are determined at 304 along a first (e.g., row) direction. For example, in the flash memory device 100 above, it may be desired to form bitline contact openings 118 having row direction dimensions substantially the same as the bitline width dimensions 113 in FIG. 1E. At 306, a series of optical features is created on a lithography mask, where the optical features are spaced from one another along the row direction, and where the individual optical features have row-direction mask feature dimensions that are smaller than the desired row direction dimension determined at 304, and the method 300 ends at 308.

In one example, the optical features on the lithography mask have row direction dimensions that are about 30 percent smaller than the desired row direction dimension, although other reduced dimension values may be used within the scope of the invention. In the example of FIG. 15A, moreover, the optical features on the lithography mask have second mask feature dimensions along the column direction that are substantially equal to the desired row direction dimension for the openings 118 to be patterned in the etch mask 117.

Figure 16A:
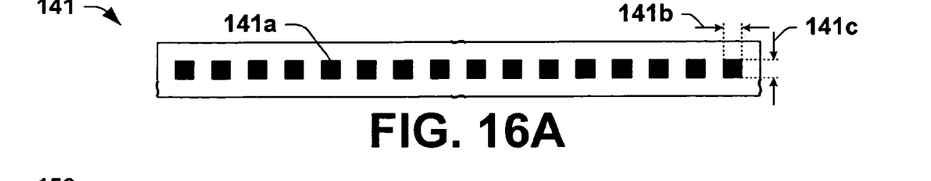
FIG. 16A is a top plan view illustrating a series of bitline contact opening features spaced from one another along a row direction and having desired row direction and column direction dimensions for a row of the bitline contacts in the device of FIGS. 1D and 1E.
Figure 16B:
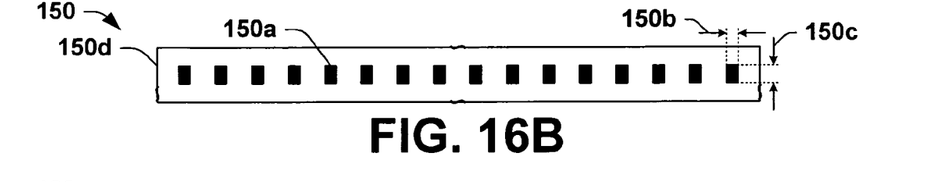
FIG. 16B is a top plan view illustrating a portion of an exemplary lithography mask with optical features having row direction dimensions smaller than the desired row direction dimensions of FIG. 16A.

Referring also to FIGS. 16A-16C, FIG. 16A illustrates a top plan view of a row of desired contact openings 141, including a row of desired, generally square, shapes 141a with desired row and column direction dimensions 141b and 141c, respectively. In one example, these dimensions 141b and 141c are substantially equal to one another and to the bitline width 113 of FIG. 1E. FIG. 16B illustrates a portion of an exemplary lithography mask 150 having a series of darkened optical features 150a with row and column direction feature dimensions 150b and 150c formed on an optically transmissive substrate 150d. Alternatively, optically transmissive features 150a could be formed on an otherwise darkened substrate 150d. In accordance with an aspect of the invention, the row direction lithography mask optical feature dimension 150b (FIG. 16B) is about 30 percent smaller than the desired row direction dimension 141b (FIG. 16A), and the column direction feature dimension 150c is substantially the same as the desired row dimension 141b.

Figure 16C:
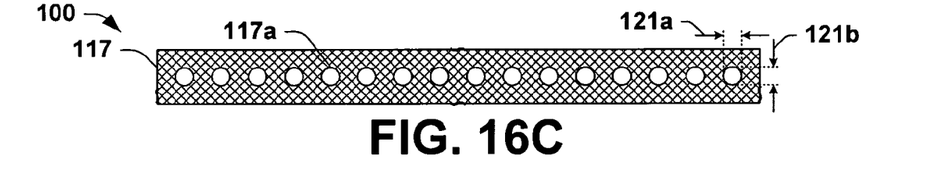
FIG. 16C is a top plan view illustrating a portion of an exemplary etch mask formed on a semiconductor device having openings with row and column direction dimensions substantially equal to the desired row direction dimensions of FIG. 16A patterned therein using the lithography mask of FIG. 16B.

This pre-shrinking or reduction of the row direction dimension in forming the optical features 150a on the mask 150 counteracts optical proximity effects and other pattern transfer distortions when the mask 150 is used to expose the etch mask resist material 117 (e.g., at 226 in FIG. 2), by which generally circular openings 117a are formed in the bitline contact etch mask 117, as shown in FIGS. 16C and 11A. In this example, the contact etch mask openings 117a have row and column direction dimensions 121a and 121b, respectively, which are substantially equal to one another and to the desired row direction dimension 141b. After the contact etching (e.g., etch process 123 in FIGS. 12 and 13 above), the contact openings 118 and the resulting contacts 112 (FIG. 14 above) will have substantially the same lateral dimensions 121a and 121b, with some process related variations, for example, due to directional fluctuations in the etch process 123 (e.g., depending on whether the process 123 is generally isotropic or anisotropic).

Figure 15B:
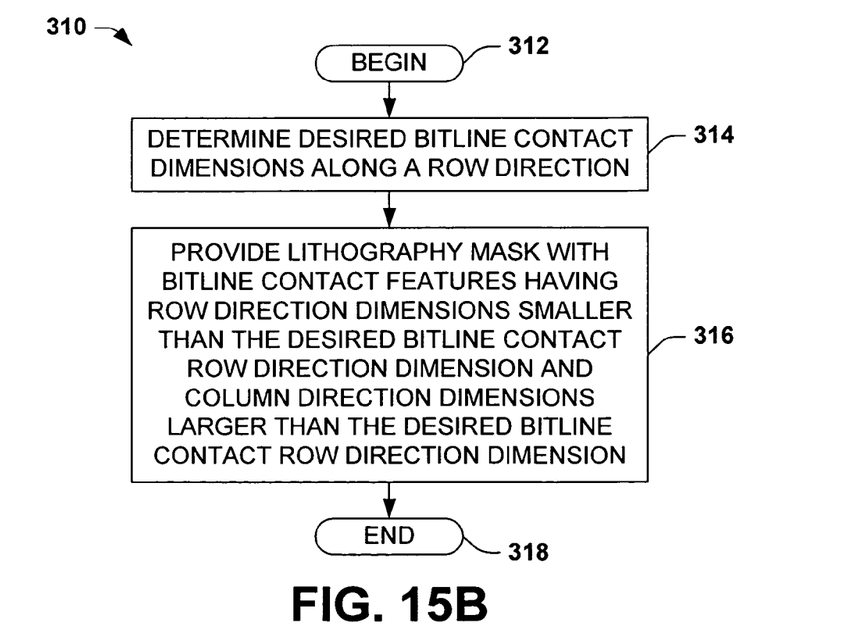

FIG. 15B illustrates another exemplary method 310 for creating optical features on a lithography mask or reticle for subsequent use in patterning a series of openings in an etch mask on a semiconductor device in accordance with the invention. Beginning at 312, desired bitline contact dimensions are determined at 314 along a first direction (e.g., the same as the bitline width dimensions 113 in FIG. 1E in one example). A series of optical features is created at 316 on a lithography mask, with the optical features being spaced from one another along the row direction, wherein the individual optical features have row direction mask feature dimensions that are smaller than the desired row direction dimension determined at 314 and column direction dimensions that are larger than the desired row direction dimension, after which the method 310 ends at 318.

Figure 17A:
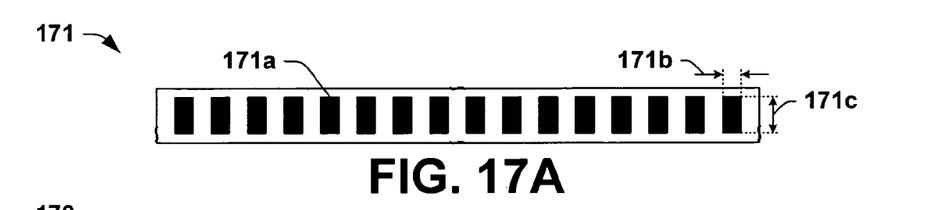
FIG. 17A is a top plan view illustrating another exemplary series of bitline contact opening features spaced from one another along a row direction having desired row direction and column direction dimensions for a row of the bitline contacts in the device of FIGS. 1D and 1E.
Figure 17B:
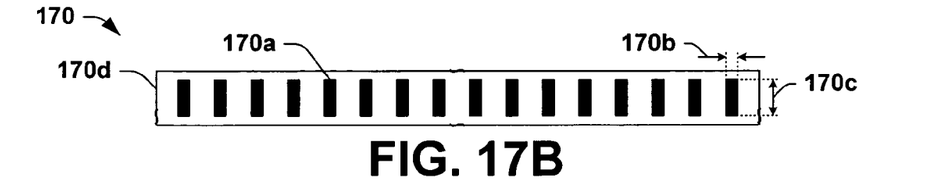
FIG. 17B is a top plan view illustrating a portion of another exemplary lithography mask with optical features having row direction dimensions smaller than the desired row direction dimensions of FIG. 17A and column direction dimensions larger than the desired row direction dimensions of FIG. 17A.
Figure 17C:
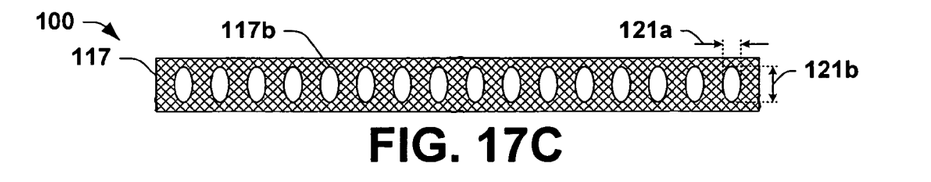
FIG. 17C is a top plan view illustrating a portion of another exemplary etch mask formed on a semiconductor device having openings with row direction dimensions substantially equal to the desired row direction dimensions of FIG. 17A and column direction dimensions larger than the desired row direction dimensions of FIG. 17A patterned therein using the lithography mask of FIG. 17B.

FIGS. 17A-17C illustrate another possible implementation of the invention, wherein the column direction dimension is elongated, for example, to further reduce bitline contact resistance in the device 100. FIG. 17A illustrates another set of desired contact openings 171, including a row of generally rectangular desired shapes 171a with desired row and column direction dimensions 171b and 171c, respectively, where the desired dimension column direction dimension 171c is larger than the desired row direction dimension 171b, and wherein the desired row direction dimension 171b is again substantially equal to the bitline width 113 of FIG. 1E. A portion of an exemplary lithography mask 170 is illustrated in FIG. 17B, having a series of darkened rectangular optical features 170a of row and column direction feature dimensions 170b and 170c, respectively, formed on an optically transmissive substrate 170d. The row direction mask feature dimension 170b in this example is about 30 percent smaller than the desired row direction dimension 171b, and the elongated column direction feature dimension 170c is larger than the desired row dimension 171b. FIG. 17C illustrates the contact etch mask 117 following patterning using the mask 170, wherein the reduction in the row direction dimension 170b in forming the features 170a on the mask 170 counteracts optical proximity effects, whereby rounded oblong openings 117b are formed in the bitline contact etch mask 117 (e.g., as also illustrated in FIG. 11B above).

Figure 18:
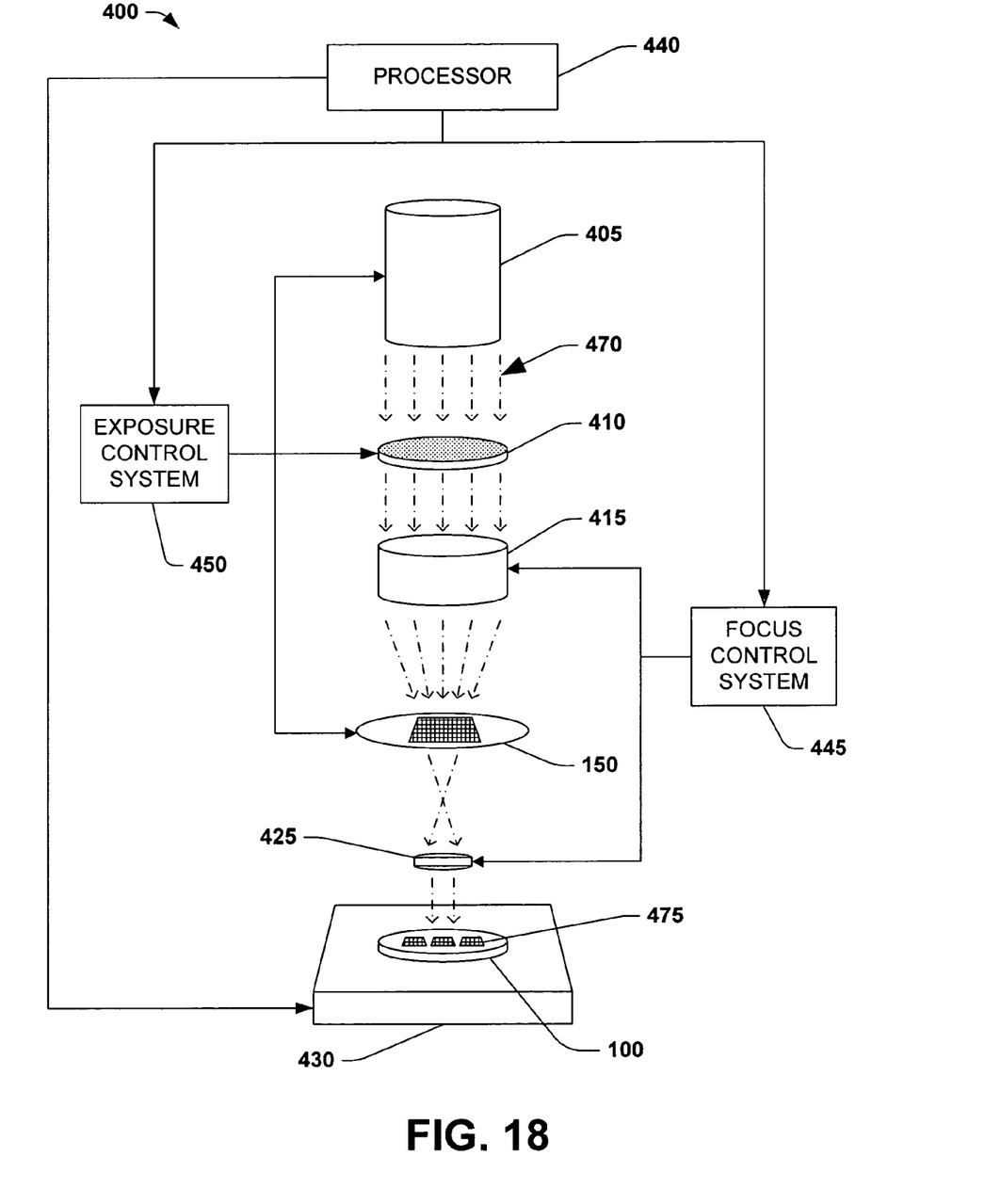
FIG. 18 is a partial schematic illustration of a stepper system that may be employed in patterning an etch mask on a wafer using a lithography mask in accordance with the present invention.

FIG. 18 illustrates an exemplary stepper system 400 in which the contact etch mask 117 may be patterned using a lithography mask (e.g., masks 150, 170 above) in practicing various aspects of the invention. The system 400 includes an illumination source 405 to produce illumination 470 (e.g., ultraviolet light), which may be controlled by modulating power supplied to the source 405, as well as by an illumination modification filter 410 (e.g., pupil filter) to spatially modulate the intensity and/or phase of the illumination 470. The system 400 also includes a condenser lens system 415 and a reduction lens system 425, each of which may be controlled (e.g., vertical position adjustment) to adjust a focus of the illumination 470 passing through the condenser lens system 415 and the reduction lens system 425. The system 400 employs the lithography mask or reticle 150 as described above, to expose a pattern 475 of the optical features 150a on the device wafer 100, wherein a positive or negative mask 150 may be provided, depending upon whether positive or negative resist material 117 is being used on the device 100. A focus control system 445 can be operatively connected to either or both of the condenser lens system 415 and the reduction lens system 425, in order to control focus parameters within the stepper system 400. In addition, an exposure control system 450 is operatively connected to one or more of the illumination source 405, the illumination modification filter 410, and the mask 150, to control exposure of the device wafer 100 to a light emitted by the source 405. The focus control system 445 and the exposure control system 450 are operatively connected to a processor 440, which controls one or more settings for the stepper system 400. A stage 430 may be indexed or "stepped" via the processor 440, in order to adjust the location of the illumination exposure 470 onto the device 100 situated therein.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

The following is claimed:

1. A method for forming contacts in a flash memory device, the method comprising:
providing a lithography mask comprising forming contact features on the lithography mask along a row direction, the contact features having contact row direction dimensions smaller than a desired contact row direction dimension;
wherein the contact features are formed to have column direction dimensions substantially equal to the desired contact row direction dimension;
patterning an etch mask in the device using the lithography mask;
etching contact openings in the device using the etch mask; and
forming conductive material in the contact openings.

2. The method of claim 1, wherein the contact features are formed to be generally rectangular contact features.

3. The method of claim 1, wherein the contact features of the lithography mask have contact row direction dimensions that are about 30 percent smaller than the desired contact row direction dimension.

4. A method for forming contacts in a flash memory device, the method comprising:
providing a lithography mask having comprising forming contact features on the lithography mask along a row direction, the contact features having contact row direction dimensions smaller than a desired contact row direction dimension, the contact features having column direction dimensions larger than the desired contact row direction dimension;
patterning an etch mask in the device using the lithography mask;
etching contact openings in the device using the etch mask; and
forming conductive material in the contact openings.

5. The method of claim 4, wherein the contact features are formed to be generally rectangular contact features.

6. The method of claim 4, wherein the contact features of the lithography mask have contact row direction dimensions that are about 30 percent smaller than the desired contact row direction dimension.

7. A method for creating openings in a semiconductor device, the method comprising:
providing a lithography mask having optical features spaced from one another along a first direction, the optical features having first mask feature dimensions along the first direction that are smaller than a desired first dimension for openings in the semiconductor device;
wherein the optical features of the lithography mask have second mask feature dimensions along a second direction that are larger than the desired first dimension, the first and second directions being substantially orthogonal;
patterning an etch mask in the semiconductor device using the lithography mask; and
etching openings in the semiconductor device using the etch mask.

8. The method of claim 7, wherein the optical features of the lithography mask have first mask feature dimensions along the first direction that are about 30 percent smaller than the desired first dimension for openings in the semiconductor device.

* * * * *